United States Patent
Park et al.

(10) Patent No.: US 6,918,046 B2
(45) Date of Patent: Jul. 12, 2005

(54) HIGH SPEED INTERFACE DEVICE FOR REDUCING POWER CONSUMPTION, CIRCUIT AREA AND TRANSMITTING/ RECEIVING A 4 BIT DATA IN ONE CLOCK PERIOD

(75) Inventors: Yong Jae Park, Seoul (KR); Jong Doo Joo, Kyoungki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 606 days.

(21) Appl. No.: 09/870,585

(22) Filed: Jun. 1, 2001

(65) Prior Publication Data

US 2002/0001360 A1 Jan. 3, 2002

(30) Foreign Application Priority Data

Jun. 30, 2000 (KR) .................................. 2000-36895

(51) Int. Cl.[7] .............................. H04L 7/00; G06F 5/06; G06F 13/00
(52) U.S. Cl. ........................ 713/400; 713/600; 711/105
(58) Field of Search ............................... 713/400, 600; 711/105, 113, 169; 365/293, 189.05

(56) References Cited

U.S. PATENT DOCUMENTS

| 5,726,950 | A | * | 3/1998 | Okamoto et al. | ........... 365/233 |
| 6,324,603 | B1 | * | 11/2001 | Niizuma et al. | ............... 710/72 |
| 6,445,642 | B2 | * | 9/2002 | Murakami | ................... 365/233 |
| 6,446,158 | B1 | * | 9/2002 | Karabatsos | ..................... 711/5 |

FOREIGN PATENT DOCUMENTS

JP          57113669 A  *  7/1982  ........... H04L/25/49

OTHER PUBLICATIONS

Wade et al, DDR–II fuels fires of DRAM debate, Jan. 28, 2000, EETIMES, pp. 4.*

Jack Robertson, Group Supports Direct Rambus DRAM Alternative, Apr. 29, 1999, TechWeb, p. 1.*

Preliminary publication of JEDEC Semiconductor Memory Standards, Aug. 1999, pp. 72.*

JEDEC Standard, Double Data Rate (DDR) SDRAM Specification, Jun. 2000, pp. 72.*

* cited by examiner

Primary Examiner—Thomas Lee
Assistant Examiner—Suresh Suryawanshi
(74) Attorney, Agent, or Firm—Pillsbury Winthrop Shaw Pittman LLP

(57) ABSTRACT

A high speed interface type device can reduce power consumption and a circuit area, and transmit/receive a 4 bit data in one clock period. The high speed interface type device includes a DRAM unit for generating first clock and clock bar signals which do not have a phase difference from a main clock signal, and second clock and clock bar signals having 90° phase difference from the first clock and clock bar signals in a write operation, storing an inputted 4 bit data in one period of the main clock signal according to the first clock to second clock bar signals, synchronizing the stored data with data strobe signals according to the first clock to second clock bar signals in a read operation, and outputting a 4 bit data in one period of the main clock signal, and a controller for transmitting a command, address signal and data signal synchronized with the main clock signal to the DRAM unit in the write operation, and receiving data signals from the DRAM unit in the read operation.

8 Claims, 4 Drawing Sheets

HIGH SPEED INTERFACE DEVICE FOR REDUCING POWER CONSUMPTION, CIRCUIT AREA AND TRANSMITTING/RECEIVING A 4 BIT DATA IN ONE CLOCK PERIOD

BACKGROUND OF THE INVENTION

1. Field of the Invention

The present invention relates in general to a high speed interface device, and in particular to an improved high speed interface type device which can improve data I/O efficiency by increasing data output in one period in an SDRAM, by four times, and which can provide a bus structure for enabling more precise synchronization of a data and a clock during high speed operation.

2. General Background and Related Art

In general, a high speed DRAM such as a direct Rambus DRAM or sync link DRAM has a higher data processing speed than a conventional DRAM. Accordingly, the direct Rambus DRAM or sync link DRAM must be used in consideration of a data processing speed of peripheral systems. It is thus difficult to use a direct Rambus DRAM or sync link DRAM in all memory products. Therefore, it is required to develop a high speed DRAM by gradually improving the existing DRAM. Recently, many companies have attempted to design a double data rate (DDR) SDRAM. The DDR SDRAM also has been actively discussed in the JECEC and the like. In the DDR SDRAM, a data or command is synchronized in a rising edge and falling edge of a clock (100 MHz). That is to say, a 2 bit data is transmitted to a clock having one period in each DQ pad. Accordingly, the 100 MHz clock can obtain a data rate corresponding to a 200 MHz clock. As a result, an external 100 MHz clock is applied, thereby generating a 200 MHz clock. In this case, when the clock duty is exactly 50%, frequency can be doubled.

FIG. 1 (Prior Art) is a block diagram of a system bus structure of a conventional interface type device. The conventional interface type device includes a controller 100 and a plurality of DRAMs 200~200n controlled by the controller 100.

FIG. 2 (Prior Art) is a timing diagram illustrating data I/O during read and write operations in the conventional interface type device. The operation of the conventional interface type device will now be explained with reference to FIG. 2 (Prior Art).

During a write operation, the controller 100 transmits a clock signal CCLK, and a command signal, an address signal and a write data signal synchronized with the clock signal CCLK to the DRAMs 200~200n. During a read operation, the controller 100 receives read data signals Data synchronized with data strobe signals DQS0, DQS1 from the DRAMs 200~200n.

In addition, in the write operation, the DRAMs 200~200n receive the clock signal CCLK, and the command signal, the address signal and the write data signal synchronized with the clock signal CCLK from the controller 100. According to the input clock signal CCLK, the DRAMs 200~200n generate a first internal clock signal locked through an internal DLL circuit (not shown), and a second internal clock signal having a 90° phase difference from the first internal clock signal. Thereafter, the DRAMs 200~200n receive a 2 bit write data in one period of the clock signal CCLK, and store the data in cells of a memory cell array according to the first and second internal clock signals.

During a read operation, the DRAMs 200~200n synchronize the data Data from the memory array with the first and second internal clock signals from the internal DLL circuit, and synchronize a 2 bit read data with the data strobe signals DQS0, DQS1 in one period of the clock signal CCLK, thereby outputting the resultant data to the controller 100.

As described above, in the conventional interface type device, the 2 bit write data synchronized with the clock signal CCLK is transmitted from the controller 100 to the DRAMs 200~200n during the write operation, and the 2 bit read data Data synchronized with the data strobe signals DQS0, DQS1 is transmitted from the DRAMs 200~200n to the controller 100 during the read operation.

When the controller 100 transmits the write data to the respective DRAMs 200~200n during the write operation, the conventional interface type device requires a write input driver circuit for synchronizing the write data with the clock signal CCLK, and transmitting the resultant data. In the case that the DRAMs 200~200n transmit the read data to the controller 100 during the read operation, the conventional interface type device requires a read output driver circuit for synchronizing the read data with the data strobe signals DQS0, DQS1, and transmitting the resultant data. That is, the conventional interface type device requires the additional write input driver and read output driver in each DRAM, thereby occupying a large circuit area. Moreover, the driver circuits increase power consumption.

SUMMARY

The claimed inventions feature at least in part a high speed interface device which can improve data I/O efficiency by increasing data outputted in one period in an SDRAM, by four times, and which can provide a bus structure for enabling more precise synchronization of a data and a clock in the high speed operation.

There is provided a high speed interface device including a DRAM unit for generating first clock and clock bar signals which do not have a phase difference from a main clock signal, and second clock and clock bar signals having 90° phase difference from the first clock and clock bar signals during a write operation, storing an inputted 4 bit data in one period of the main clock signal according to the first clock to second clock bar signals, synchronizing the stored data with data strobe signals according to the first clock to second clock bar signals in a read operation, and outputting a 4 bit data in one period of the main clock signal. A controller transmits a command, address signal and data signal synchronized with the main clock signal to the DRAM unit during the write operation, and receives data signals from the DRAM unit during the read operation.

In the high speed interface type device according to the present invention, a circuit for generating the data strobe signals, includes a first delay unit for receiving the first clock signal. A first buffer unit is connected between an output terminal of the first delay unit and an output terminal for outputting a first data strobe signal. A second delay unit receives the second clock signal. A second buffer unit is connected between an output terminal of the second delay unit and an output terminal for outputting a second data strobe signal.

The DRAM unit includes a third buffer unit for receiving the main clock signal and a main clock bar signal from the controller. A DLL unit delays locking the output signals from the third buffer unit, and generates the first clock and clock bar signals. A fourth buffer unit buffers and outputs the first clock and clock bar signals from the DLL unit, and transmits the first clock and clock bar signals to the DLL unit. A phase shift unit receives the first clock and clock bar signals from the DLL unit, and generates the second clock and clock bar signals having 90° phase difference. A fifth buffer unit receives and buffers the output signals from the phase shift unit. A write latch unit stores inputted write data according to the first clock to second clock bar signals. A read latch unit stores read data from a read sense amp according to the first clock to second clock bar signals.

The write latch unit includes a first latch unit for storing a first data from an input buffer according to the first clock signal in the write operation A second latch unit stores a second data from the input buffer according to the second clock signal in the write operation. A third latch unit stores a third data from the input buffer according to the first clock bar signal in the write operation. A fourth latch unit stores a fourth data from the input buffer according to the second clock bar signal during the write operation.

The read latch unit includes a first latch unit for storing a first data from the read sense amp unit according to the first clock signal in the read operation. A second latch unit stores a second data from the read sense amp unit according to the second clock signal during the read operation. The third latch unit stores a third data from the read sense amp unit according to the first clock bar signal during the read operation. A fourth latch unit stores a fourth data from the read sense amp unit according to the second clock bar signal during the read operation.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION

Figure 1:
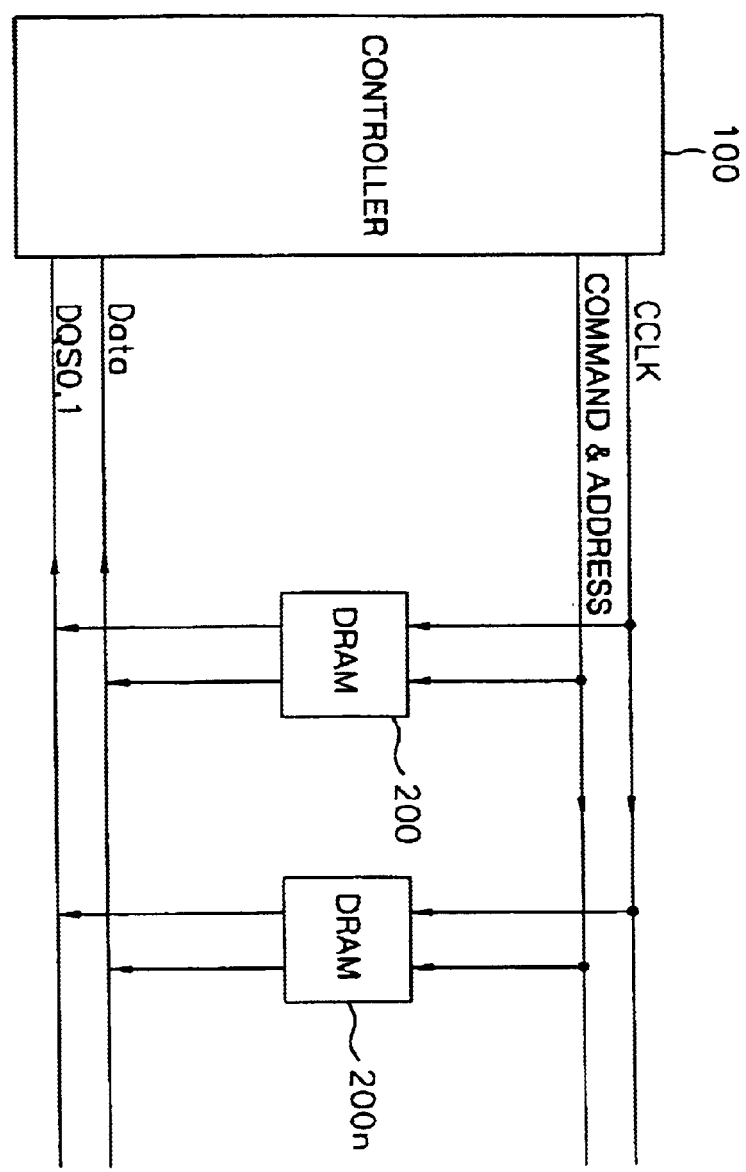
FIG. 1 (Prior Art) is a schematic diagram illustrating a system bus structure of a conventional interface type device.
Figure 2:
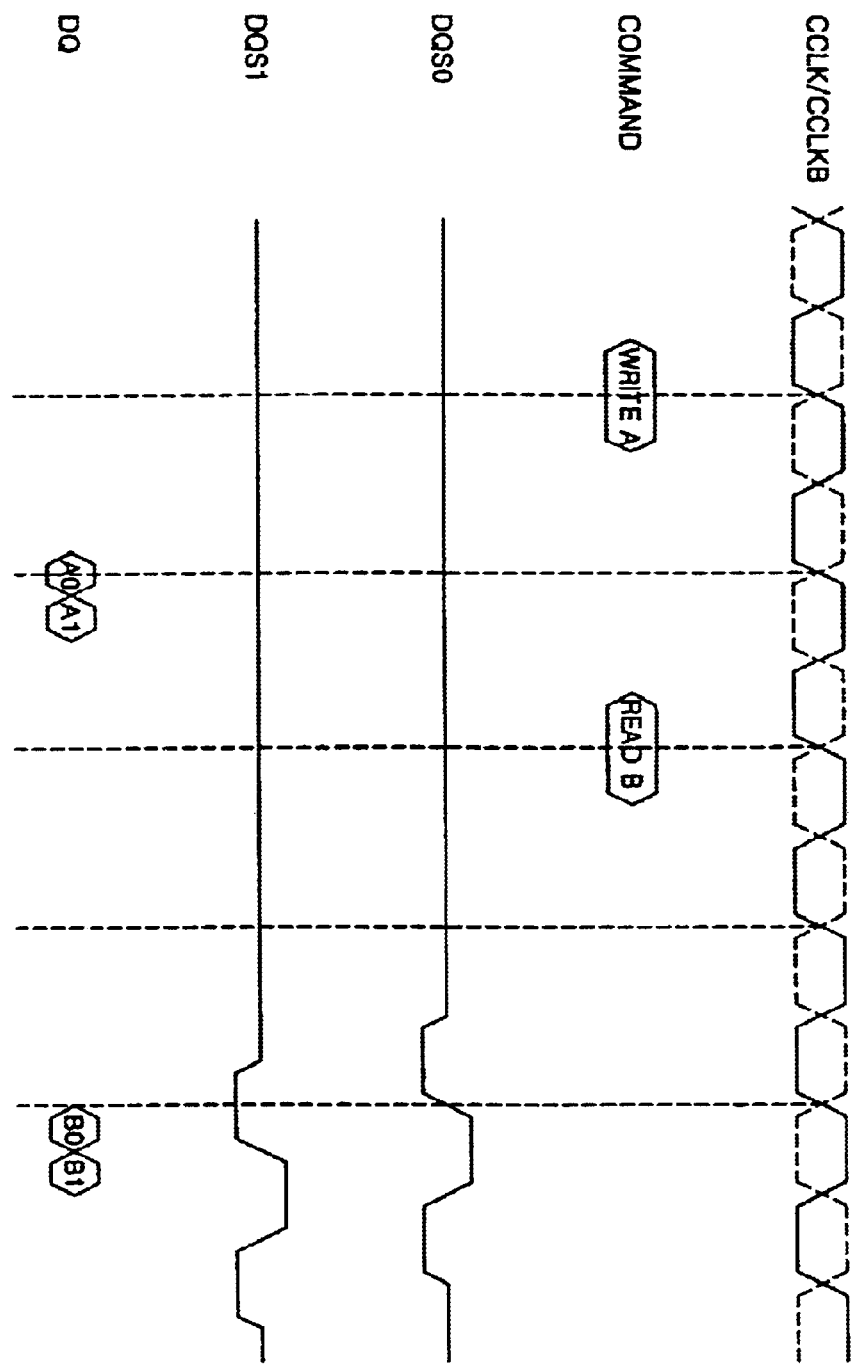
FIG. 2 (Prior Art) is a timing diagram illustrating a data I/O in read and write operations in the conventional interface type device.

A high speed interface device in accordance with a preferred embodiment of the present invention will now be described in detail with reference to the accompanying drawings. Elements having an identical or similar function are provided with the identical reference numeral, and repeated explanations thereof will be omitted.

Figure 3:
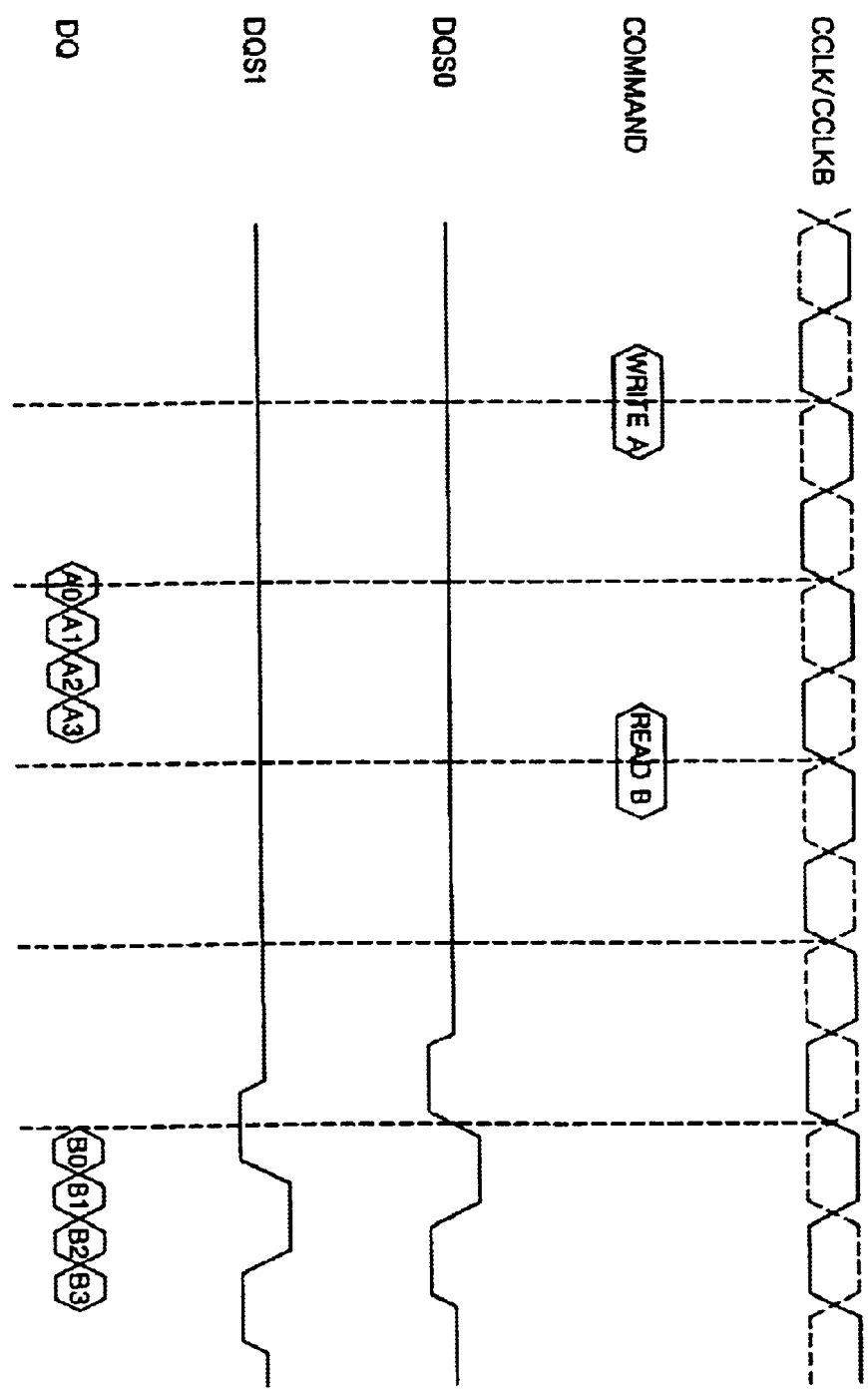
FIG. 3 is a timing diagram illustrating a data I/O in read and write operations in a high speed interface device in accordance with the present invention.

FIG. 3 is a timing diagram illustrating a data I/O in read and write operations in the high speed interface type device in accordance with the present invention. The high speed interface type device will now be explained with reference to FIG. 3 and the system bus structure of the conventional interface type device in FIG. 1 (Prior Art).

When the respective DRAMs 200~200n receive a clock signal CCLK from a controller 100, and then receive a write command signal WRITE A, the DRAMs 200~200n receive a write data signal synchronized with the clock signal CCLK from the controller 100. The write data signal inputted to the DRAMs 200~200n is a 4 bit write data signal generated in one period of the clock signal CCLK. At this time, the 4 bit write data signal is generated in a succeeding period of the clock signal CCLK from the period of the clock signal CCLK when the write command signal WRITE A is applied.

When the respective DRAMs 200~200n receive the clock signal CCLK from the controller 100, and then receive a read command signal READ A, the DRAMs 200~200n generate first and second data strobe signals DQS0, DQS1 by delay locking the clock signal CCLK from the controller 100. The first and second data strobe signals DQS0, DQS1 have 90° phase difference from each other. The DRAMs 200~200n synchronize a 4 bit read data signal with the first and second data strobe signals DQS0, DQS1 in one period of the clock signal CCLK, and consecutively transmit them to the controller 100.

The write and read data are transmitted in one period of the clock signal CCLK by 4 bits. Accordingly, a data transmission speed of the high speed interface type device of the present invention is higher than that of the conventional DDR SDRAM transmitting a 2 bit data in one period of the clock signal by two times.

Figure 4:
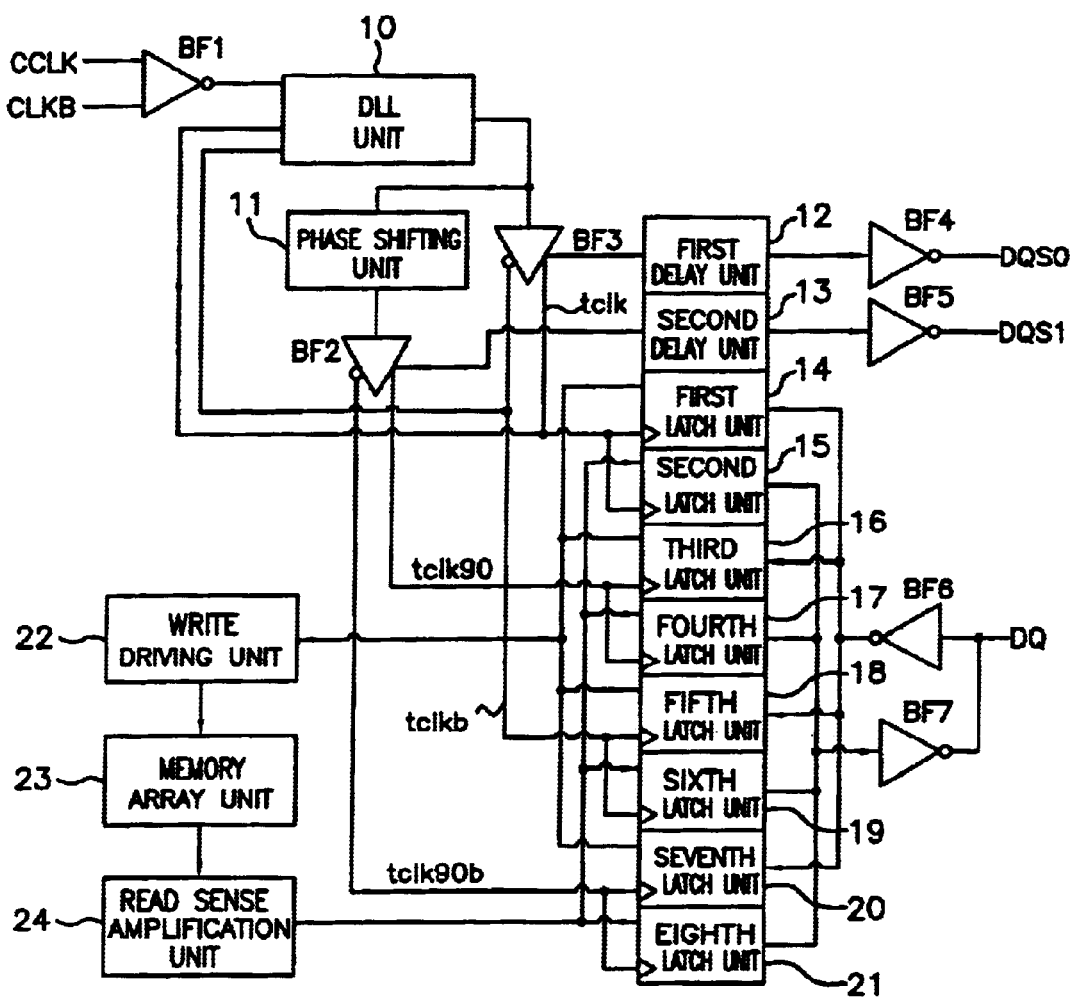
FIG. 4 is a schematic diagram illustrating a data I/O structure in a DRAM of the high speed interface type device in accordance with the present invention.

FIG. 4 is a schematic diagram of a data I/O structure in the DRAM of the high speed interface type device in accordance with the present invention. The DRAM of the high speed interface type device includes a first buffer BF1 for receiving the clock signal CCLK and a clock bar signal CCLKB from the controller 100. A DLL unit 10 delays locking the output signals from the first buffer BF1, and generates first clock and clock bar signals tclk, tclkb. A third buffer BF3 buffers and outputs the first clock and clock bar signals tclk, tclkb from the DLL unit 10, and transmits the first clock and clock bar signals tclk, tclkb to the DLL unit 10. A phase shift unit 11 receives the first clock and clock bar signals tclk, tclkb from the DLL unit 10, and generates second clock and clock bar signals tclk90, tclkb90 having 90° phase difference. A second buffer BF2 receives and buffers the output signals from the phase shift unit 11, and outputs the second clock and clock bar signals tclk90, tclkb90. In addition, the DRAM includes a first latch unit 14 for storing write data inputted through a DQ pad and an input buffer BF6 according to the first clock signal tclk from the third buffer BF3 during a write operation. A second latch unit 15 stores read data from a read sense amp unit 24 according to the first clock signal tclk from the third buffer BF3 during a read operation. A third latch unit 16 stores write data inputted through the DQ pad and the input buffer BF6 according to the first clock bar signal tclkb from the second buffer BF2 in the write operation. A fourth latch unit 17 stores read data from the read sense amp unit 24 according to the second clock signal tclk90 from the second buffer BF2 during the read operation. A fifth latch unit 18 stores write data input through the DQ pad and the input buffer BF6 according to the first clock bar signal tclkb from the third buffer BF3 during the write operation. A sixth latch unit 19 stores read data from the read sense amp unit 24 according to the first clock bar signal tclkb from the third buffer BF3 during the read operation. A seventh latch unit 20 stores write data input through the DQ pad and the input buffer BF6 according to the second clock bar signal tclkb90 from the second buffer BF2 during the write operation. An eighth latch unit 21 stores read data from the read sense amp unit 24 according to the second clock bar signal tclkb90 from the third buffer BF3 during the read operation. The DRAM also includes a write driver unit 22 for driving the write data from the first, third, fifth and seventh latch units 14, 16, 18, 20. A memory array unit 23 stores the write data from the write driver unit 22. A read sense amp unit 24 senses the data stored in the memory array unit 23 during the read operation.

During the read operation, the seventh buffer BF7 outputs the read data stored in the second, fourth, sixth and eighth latch units 15, 17, 19, 21 to the DQ pad in every ¼ period of the clock signal CCLK according to the first clock to second clock bar signals tclk, tclkb, tclk90, tclkb90.

During the write operation, the sixth buffer BF6 receives the write data inputted from the DQ pad in every ¼ period of the clock signal CCLK, and transmits the write data to the first, third, fifth and seventh latch units 14, 16, 18, 20 according to the first clock to second clock bar signals tclk, tclkb, tclk90, tclkb90.

In addition, the DRAM includes a first delay unit 12 and a fourth buffer BF4 connected in series between a terminal for receiving the first clock signal tclk from the third buffer BF3 and a terminal for outputting the data strobe signal DQS0. A second delay unit 13 and a fifth buffer BF5 are connected in series between a terminal for receiving the second clock signal tclk90 from the second buffer BF2 and a terminal for outputting the data strobe signal DQS1.

The write operation of the DRAM will now be described. When the DRAM 200 receives a data synchronized with the clock signal CCLK and the write command signal from the controller 100, the DRAM 200 generates the first clock and clock bar signals tclk, tclkb which are delay locked by the DLL unit 10. The phase shift unit 11 receives the output signals from the DLL unit 11, and generates the second clock and clock bar signals tclk90, tclkb90 having 90° phase difference from the first clock and clock bar signals tclk, tclkb. The first, third, fifth and seventh latch units 14, 16, 18, 20 respectively store the write data inputted through the DQ pad and the input buffer BF6 according to the first clock to second clock bar signals tclk, tclkb, tclk90, tclkb90. The stored write data are transmitted to the write driver unit 22, and then stored in memory cells of the memory array unit 23.

During the read operation, when the DRAM 200 receives a read command signal from the controller 100, the data stored in the cells of the memory array unit 23 are sensed in the read sense amp unit 24, and respectively stored in the second, fourth, sixth and eighth latch units 15, 17, 19, 21 according to the first clock to second clock bar signals tclk, tclkb, tclk90, tclkb90. The stored read data are outputted through the data output buffer BF7 and the DQ pad in every ¼ period of the clock signal CCLK. The data strobe signals DQS0, DQS1 using the first and second clock signals tclk, tclk90 are output with the read data from the DQ pad. Thus, the 4 bit data is transmitted/received in one clock period of the DQ pad.

As discussed earlier, the high speed interface type device in accordance with the present invention has high data I/O efficiency even in a low clock frequency, by transmitting/receiving the 4 bit data in one clock period of the DQ pad.

In addition, the high speed interface type device generates the first clock and clock bar signals delay locked by the internal DLL unit 10 receiving the clock signal CCLK during the write operation, and generates the second clock and clock bar signals having 90° phase difference through the DLL unit 10, thereby more precisely receiving the write signals from the controller 100 according to the first clock to second clock bar signals.

Moreover, the high speed interface type device does not employ the data strobe signal DQS in the write operation as in the DDR SDRAM, and thus does not require a write output driver in the controller 100, thereby reducing a circuit area and power consumption.

The claimed inventions may be embodied in several forms without departing from the spirit or essential characteristics thereof. Therefore, it should also be understood that the above-described embodiment is merely exemplary and is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A high speed interface device, comprising:

a DRAM unit for generating first clock and first clock bar signals which do not have a phase difference from a main clock signal, and second clock and second clock bar signals having 90° phase difference from the first clock and clock bar signals during a write operation, storing an inputted 4 bit data in one period of the main clock signal according to the first and second clock and clock bar signals, synchronizing the stored data with data strobe signals according to the first and second clock and clock bar signals during a read operation, and outputting a 4 bit data during one period of the main clock signal;

a controller for transmitting a command, address signal and data signal synchronized with the main clock signal to the DRAM unit during the write operation, and receiving data signals from the DRAM unit during the read operation; and, further including a circuit for generating the data strobe signals, comprising:

a first delay unit for receiving the first clock signal;

a first buffer unit connected between an output terminal of the first delay unit and an output terminal for outputting a first data strobe signal;

a second delay unit for receiving the second clock signal; and a second buffer unit connected between an output terminal of the second delay unit and an output terminal for outputting a second data strobe signal.

2. A high speed interface device, comprising:

a DRAM unit for generating first clock and first clock bar signals which do not have a phase difference from a main clock signal, and second clock and second clock bar signals having 90° phase difference from the first clock and clock bar signals during a write operation, storing an inputted 4 bit data in one period of the main clock signal according to the first and second clock and clock bar signals, synchronizing the stored data with data strobe signals according to the first and second clock and clock bar signals during a read operation, and outputting a 4 bit data during one period of the main clock signal; and a controller for transmitting a command, address signal and data signal synchronized with the main clock signal to the DRAM unit during the write operation, and receiving data signals from the DRAM unit during the read operation, wherein the DRAM unit comprises:

a third buffer unit for receiving the main clock signal and a main clock bar signal from the controller;

a DLL unit for delay locking output signals from the third buffer unit, and generating the first clock and first clock bar signals;

a fourth buffer unit for buffering and outputting the first clock and first clock bar signals from the DLL unit, and transmitting the first clock and first clock bar signals to the DLL unit;

a phase shift unit for receiving the first clock and first clock bar signals from the DLL unit, and generating the second clock and second clock bar signals;

a fifth buffer unit for receiving and buffering output signals from the phase shift unit;

a write latch unit for storing inputted write data according to the first and second clock and first and second clock bar signals; and a read latch unit for storing read data from a read sense amp according to the first and second clock signal and first and second clock bar signals.

3. The device according to claim 2, wherein the write latch unit comprises:

a first latch unit for storing a first data from an input buffer according to the first clock signal during the write operation;

a second latch unit for storing a second data from the input buffer according to the second clock signal during the write operation;

a third latch unit for storing a third data from the input buffer according to the first clock bar signal during the write operation; and a fourth latch unit for storing a fourth data from the input buffer according to the second clock bar signal during the write operation.

4. The device according to claim 2, wherein the read latch unit comprises:

a first latch unit for storing a first data from the read sense amp unit according to the first clock signal during the read operation;

a second latch unit for storing a second data from the read sense amp unit according to the second clock signal during the read operation;

a third latch unit for storing a third data from the read sense amp unit according to the first clock bar signal during the read operation; and a fourth latch unit for storing a fourth data from the read sense amp unit according to the second clock bar signal during the read operation.

5. A high speed interface type device for a memory device, comprising:

a first buffer part receiving a main clock signal;

a DLL circuit part receiving an output of the first buffer part and outputting an internal clock signal being synchronized with the main clock signal;

a second buffer receiving the internal clock signal and outputting a first clock signal a second clock signal;

a phase shift part receiving the internal clock signal of the DLL circuit part and shifting the phase of the internal clock signal by 90 degree;

a third buffer receiving an output of the phase shift part and outputting a third clock signal a fourth clock signal; and a latch part receiving the first to fourth clock signals, wherein the phase of the first clock signal is in synchronism with the phase of the main clock signal, the phase of the second clock signal is in synchronism with a phase of a signal being generated by inverting the main clock signal, the phase of the third clock signal is more lagged by 90 degree than the phase of the main clock signal, the phase of the fourth clock signal is in synchronism with a phase of a signal being generated by inverting the third clock signal, and data latched in the latch part is outputting or inputting in synchronism with the rising edge of the first to fourth clock signals.

6. The high speed interface type device according to claim 5, wherein the latch part includes a first latch being controlled by the first clock signal, a second latch being controlled by the second clock signal, a third latch being controlled by the third clock signal, and a fourth latch being controlled by the fourth clock signal.

7. The high speed interface type device according to claim 5, wherein data outputting from the latch part or inputting to the latch part in synchronous with the first to forth clock signals, during one period of the main clock signal, are 4 bits.

8. The high speed interface type device according to claim 5, wherein a duty ratio of the first clock signal is 50%.

* * * * *